US008115515B2

(12) United States Patent
Roper

(10) Patent No.: US 8,115,515 B2
(45) Date of Patent: Feb. 14, 2012

(54) RADIATION HARDENED DIFFERENTIAL OUTPUT BUFFER

(75) Inventor: Weston Roper, Shakopee, MN (US)

(73) Assignee: Honeywell International Inc., Morristown, NJ (US)

( * ) Notice: Subject to any disclaimer, the term of this patent is extended or adjusted under 35 U.S.C. 154(b) by 83 days.

(21) Appl. No.: 11/390,740

(22) Filed: Mar. 28, 2006

(65) Prior Publication Data

US 2007/0236246 A1  Oct. 11, 2007

(51) Int. Cl.
 *H03K 19/094* (2006.01)
(52) U.S. Cl. ............. 326/83; 329/13; 329/14; 329/86; 329/87; 327/109; 327/112
(58) Field of Classification Search ........... 326/9–15, 326/82–83, 86–87; 327/108–109, 112
See application file for complete search history.

(56) References Cited

U.S. PATENT DOCUMENTS

| | | | | |
|---|---|---|---|---|
| 4,189,785 A | 2/1980 | Rapp | ............................ | 365/156 |
| 4,782,467 A | 11/1988 | Belt et al. | ...................... | 365/154 |
| 4,805,148 A | 2/1989 | Diehl-Nagle et al. | ........ | 365/154 |
| 5,134,312 A | 7/1992 | Jones, Jr. et al. | ........... | 307/272.2 |
| 5,175,605 A | 12/1992 | Pavlu et al. | .................... | 257/369 |
| 5,220,192 A | 6/1993 | Owens et al. | ................. | 257/519 |
| 5,311,070 A * | 5/1994 | Dooley | .......................... | 327/208 |
| 5,406,513 A | 4/1995 | Canaris et al. | ................ | 365/181 |
| 5,408,497 A * | 4/1995 | Baumann et al. | ............. | 375/219 |
| 5,631,863 A | 5/1997 | Fechner et al. | ............... | 365/156 |
| 5,644,266 A | 7/1997 | Chen et al. | ................... | 327/534 |
| 5,977,796 A * | 11/1999 | Gabara | .......................... | 326/86 |
| 6,058,041 A | 5/2000 | Golke et al. | .................. | 365/156 |
| 6,094,068 A | 7/2000 | Nomura et al. | ................ | 326/83 |
| 6,127,864 A | 10/2000 | Mavis et al. | ................... | 327/144 |
| 6,278,287 B1 | 8/2001 | Baze | ................................ | 326/9 |
| 6,288,581 B1 * | 9/2001 | Wong | ............................ | 327/108 |
| 6,294,947 B1 * | 9/2001 | Gabara | ......................... | 327/403 |
| 6,326,809 B1 | 12/2001 | Gambles et al. | ................ | 326/46 |
| 6,327,176 B1 | 12/2001 | Li et al. | ........................... | 365/156 |
| 6,356,101 B1 | 3/2002 | Erstad | ............................. | 326/27 |
| 6,377,097 B1 * | 4/2002 | Shuler, Jr. | ..................... | 327/208 |
| 6,433,983 B1 | 8/2002 | Fechner | ........................ | 361/111 |
| 6,445,241 B2 * | 9/2002 | Gabara | ......................... | 327/404 |
| 6,525,590 B2 * | 2/2003 | Swonger | ....................... | 327/403 |
| 6,563,347 B2 | 5/2003 | Doyle et al. | .................... | 327/65 |
| 6,614,257 B2 * | 9/2003 | Knowles | ........................... | 326/9 |
| 6,686,772 B2 * | 2/2004 | Li et al. | ............................ | 326/83 |
| 6,753,694 B2 | 6/2004 | Eaton | .............................. | 326/13 |

(Continued)

OTHER PUBLICATIONS

Niu et al., "A Comparison of SEY Tolerance in High-Speed SiGe HBT Digital Logic Designed With Multiple Circuit Architectures" IEEE Transactions on Nuclear Science, IEEE Service Center, New York, NY, US, vol. 49, No. 6, Dec. 2002.*

(Continued)

*Primary Examiner* — Jason M Crawford
(74) *Attorney, Agent, or Firm* — Shumaker & Sieffert, P.A.

(57) ABSTRACT

A radiation hardened differential output buffer is partitioned into multiple stages, each including at least one current source and a bridge circuit. Each stage receives substantially the same inputs at substantially the same time, and provides substantially the same output. The outputs of each stage are connected together. As a result, if one of the stages is disrupted by SEE, the disrupted stage does not contribute enough current to the output of the differential output buffer to disrupt the output signal.

18 Claims, 3 Drawing Sheets

U.S. PATENT DOCUMENTS

| | | | |
|---|---|---|---|
| 6,756,809 B2 | 6/2004 | Eaton | 326/13 |
| 6,794,908 B2 | 9/2004 | Erstad | 327/112 |
| 6,812,733 B1 * | 11/2004 | Plasterer et al. | 326/30 |
| 6,838,899 B2 | 1/2005 | Plants | 326/9 |
| 6,853,220 B2 * | 2/2005 | De Laurentiis et al. | 327/108 |
| 6,897,685 B2 * | 5/2005 | Sato | 326/86 |
| 6,940,302 B1 * | 9/2005 | Shumarayev et al. | 326/26 |
| 2002/0017924 A1 | 2/2002 | Knowles | 326/119 |
| 2002/0101269 A1 | 8/2002 | Swonger | 327/199 |
| 2002/0175713 A1 | 11/2002 | Knowles | 326/119 |
| 2003/0141919 A1 * | 7/2003 | Wang et al. | 327/390 |
| 2005/0285620 A1 * | 12/2005 | Wehage et al. | 326/16 |
| 2007/0013411 A1 * | 1/2007 | Asaduzzaman et al. | 326/83 |

OTHER PUBLICATIONS

International Search Report for PCT/US2007/064872 dated Sep. 4, 2007.

Goufu Niu et al., "A Comparison of SEU Tolerance in High-Speed SiGe HBT Digital Logic Designed with MultipleCircuit Architectures," IEEE Transactions on Nuclear Scinece, IEEE Service Center, Ney York, NY, US, vol. 49, No. 6, Dec. 2002, XP011077936, ISSN: 0018-9499.

Masatomi Okabe et al., "Design for Reducing Alpha-Particle-Induced Soft Errors in ECL Logic Curitry," IEEE Journal of Solid-State Circuits, IEEE Service Center, Piscataway, NJ, US, vol. 24, No. 5, Oct. 1, 1989, pp. 1397-1403, XP000066351, ISSN: 0018-9200.

Written Opinion and International Preliminary Report on Patentability from corresponding PCT Application No. PCT/US2007/064872, dated Sep. 28, 2008, 8 pages.

International Preliminary Report on Patentability from corresponding PCT Application No. PCT/US2007/064872, dated Sep. 30, 2008, 9 pages.

Reply to communication from the Examining Division, for corresponding EP Application No. 07759329, dated Oct. 15, 2009, 15 pages.

Examination Report from corresponding EP Application No. 07759329, dated Jun. 5, 2009, 2 pages.

* cited by examiner

RADIATION HARDENED DIFFERENTIAL OUTPUT BUFFER

FIELD

The present invention relates generally to differential output buffers, and more particularly, relates to a differential output buffer that has enhanced performance in total dose, dose rate, and single event effect environments.

BACKGROUND

Many digital communication designs include differential output buffers. Two common differential output buffers are Low-Voltage Differential Signaling (LVDS) and Differential Current Mode Logic (CML). A typical LVDS differential output buffer 100 is depicted in FIG. 1, while a typical CML differential output buffer 200 is depicted in FIG. 2.

The LVDS differential output buffer 100 is usually fabricated using four CMOS transistors 102-108 connected in a bridge formation as shown in FIG. 1. The differential output buffer 100 also includes a current source 110. The differential output buffer 100 operates by steering current through a termination resistor 112, which is typically 100 Ohms, located at a remote receiver 114. For a logic-1, current flows from the current source 110 through the transistor 104, through the termination resistor 112, and to ground through the transistor 106. For a logic-0, current flows from the current source 110 through the transistors 102, 108 and the termination resistor 112.

During steady-state conditions, the transistors 102-108 are either in saturation or cutoff, and current does not flow from the current source 110 to ground without going through the termination resistor 112. While this provides for low-power operation at low frequencies, it limits the speed at which the transistors are able to switch.

The CML differential output buffer 200 is typically fabricated using two resistors 202, 204 and two transistors 206, 208 connected in a bridge formation as shown in FIG. 2. The transistors 206, 208 may be CMOS transistors as depicted in FIG. 2, bipolar transistors, or any other suitable transistor type. The differential output buffer 200 also includes a current source 210. For a logic-1, current travels though one of the resistors 202, 204, through a termination resistor 212 (typically 100 Ohms, located at a remote receiver 114), through one of the transistors 206, 208, and into the current source 210. For a logic-0, the current flows through the other resistor and transistor in the output buffer 200.

The operation of the CML differential output buffer 200 is similar to the LVDS differential output buffer 100, except the transistors 206, 208 operate in the linear range. Because of this linear operation, there is a small current that flows from the current source to ground through both resistors 202, 204 and transistors 206, 208 in the CML differential output buffer 200. By operating the transistors 206, 208 in their linear range, the CML differential output buffer 200 can operate at very high frequencies.

A differential output buffer, such as the buffers depicted in FIGS. 1-2, may be used in applications in which the buffer is exposed to harsh environments, such as space and military applications. However, the current sources and transistors in the differential output buffers may be susceptible to Single Event Effects (SEE). SEE is a disturbance in an active semiconductor device caused by a single energetic particle. As semiconductor devices become smaller and smaller, transistor threshold voltages decrease. These lower thresholds reduce the charge per node needed to cause errors. As a result, the semiconductor devices become more and more susceptible to transient upsets.

One type of SEE is a single event upset (SEU). SEU is a radiation-induced error in a semiconductor device caused when charged particles lose energy by ionizing the medium through which they pass, leaving behind a wake of electron-hole pairs. The electron-hole pairs form a parasitic conduction path, which can cause a false transition on a node. The false transition, or glitch, can propagate through the semiconductor device and may ultimately result in the disturbance of a node containing state information, such as an output of a latch, register, or gate.

Typically, an SEU is caused by ionizing radiation components, such as neutrons, protons, and heavy ions. The ionizing radiation components are abundant in space and at commercial flight altitudes. Additionally, an SEU may be caused by alpha particles from the decay of trace concentrations of uranium and thorium present in some integrated circuit packaging. As another example, an SEU may be caused by detonating nuclear weapons. When a nuclear weapon is detonated, intense fluxes of gamma rays, x-rays, and other high energy particles are created, which may cause SEU.

Thus, it would be beneficial to harden a differential output buffer so that the buffer may be used in applications that are susceptible to SEE.

SUMMARY

A radiation hardened differential output buffer is described. In one example, the differential output buffer includes a plurality of stages designed to provide a substantially similar output signal upon receiving a substantially similar input signal. An output of each of the plurality of stages is electrically connected to provide an output of the differential output buffer. A radiation induced disruption in a single stage is unable to change the output of the differential output buffer. Due to the separation of stages, neither single nor double radiation induced disruptions can bridge across multiple stages. The differential output buffer also includes a drive circuit controlling the plurality of stages by providing the substantially similar input signals to each of the plurality of stages. As a result, the output of the differential output buffer remains unchanged if one of the stages is temporarily impacted by the Single Event Effect as no one stage contributes enough current to alter the state of the differential output buffer.

Each of the stages includes at least one current source and a bridge circuit. Preferably, each of the plurality of stages includes two current sources. In one example, the bridge circuit includes four transistors. In another example, the bridge circuit includes two transistors and two resistors.

The number of stages in the radiation hardened differential output buffer is selected based on an amount of current supplied by the at least one current source. The output of each of the stages is a differential current signal. The pre-drive circuit provides a complementary digital signal to each of the stages. The pre-drive circuit provides the complementary digital signal to the different drive stages at substantially the same time.

In another example, the differential output buffer includes a plurality of stages having two current sources connected to a transistor bridge circuit. Each of the plurality of stages is designed to provide a substantially similar differential current output signal upon receiving a substantially similar complementary digital input signal. An output of each of the plurality of stages is electrically connected to provide an output of the differential output buffer. The differential output buffer also includes a pre-drive circuit for providing the complementary digital input signal to each of the plurality of stages. A particle strike on one of the plurality of stages is unable to cause an erroneous signal at the output of the differential output buffer. Due to the separation of stages, neither single nor double radiation induced disruptions can bridge across multiple stages.

The number of stages included in the differential output buffer is selected based on an amount of current supplied by the at least one current source. The transistor bridge circuit includes two p-channel transistors and two n-channel transistors. The pre-drive circuit provides the complementary digital input signals to the stages at substantially the same time. The pre-drive circuit delays the input signals to the stages so that the input signals reach the stages at substantially the same time.

A method of hardening a differential output buffer against a Single Event Effect is also described. The method includes selecting a number of stages each having at least one current source and a bridge circuit; connecting an output of each of the stages to a node; and driving the stages with a digital signal. Each of the stages provides a current signal in response to the digital signal. An output of one of the stages is unable to disrupt a signal at the node. As a result, a current signal change caused by the Single Event Effect at one of the stages does not impact the differential output buffer.

The number of stages is selected based on an amount of current supplied by the at least one current source. Driving the stages with a digital signal includes controlling the operation of the stages. For example, controlling the stages may include delaying the digital signal so that the digital signal pre-drives each of the stages at substantially the same time.

These as well as other aspects and advantages will become apparent to those of ordinary skill in the art by reading the following detailed description, with reference where appropriate to the accompanying drawings. Further, it is understood that this summary is merely an example and is not intended to limit the scope of the invention as claimed.

BRIEF DESCRIPTION OF THE DRAWINGS

Presently preferred embodiments are described below in conjunction with the appended drawing figures, wherein like reference numerals refer to like elements in the various figures, and wherein.

DETAILED DESCRIPTION

Figure 1:
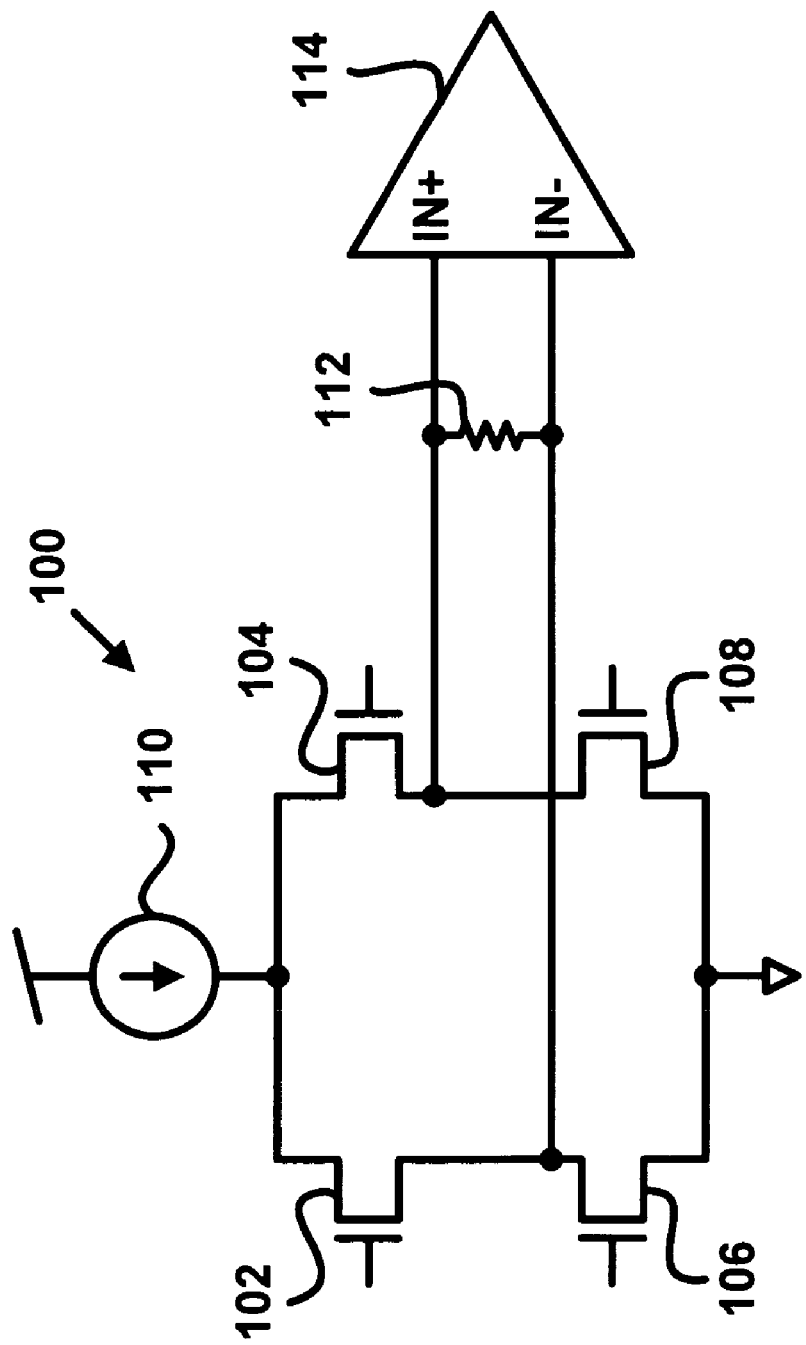
FIG. 1 is a circuit diagram of a typical LVDS differential output buffer, according to an example.
Figure 2:
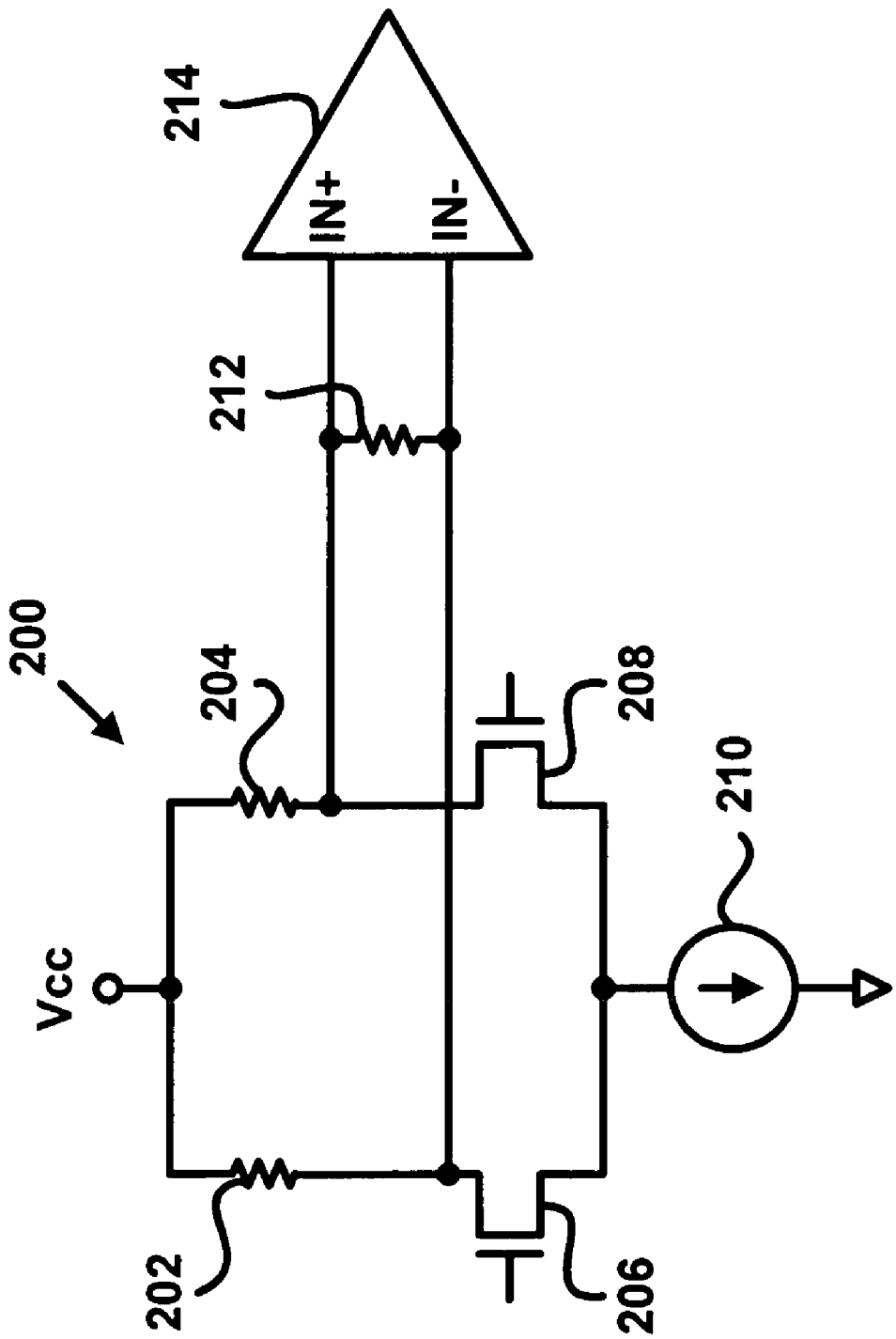
FIG. 2 is a circuit diagram of a typical CML differential output buffer, according to an example.

Instead of using a steered current differential output buffer, such as the differential output buffers 100, 200 depicted in FIGS. 1-2, a voltage steering scheme is used to harden a differential output buffer in total dose, dose rate, and SEE environments. The differential output buffer is more resilient to SEE than traditional LVDS and CML-style output buffers. One example of a steered voltage differential output buffer is depicted in FIG. 3.

Figure 3:
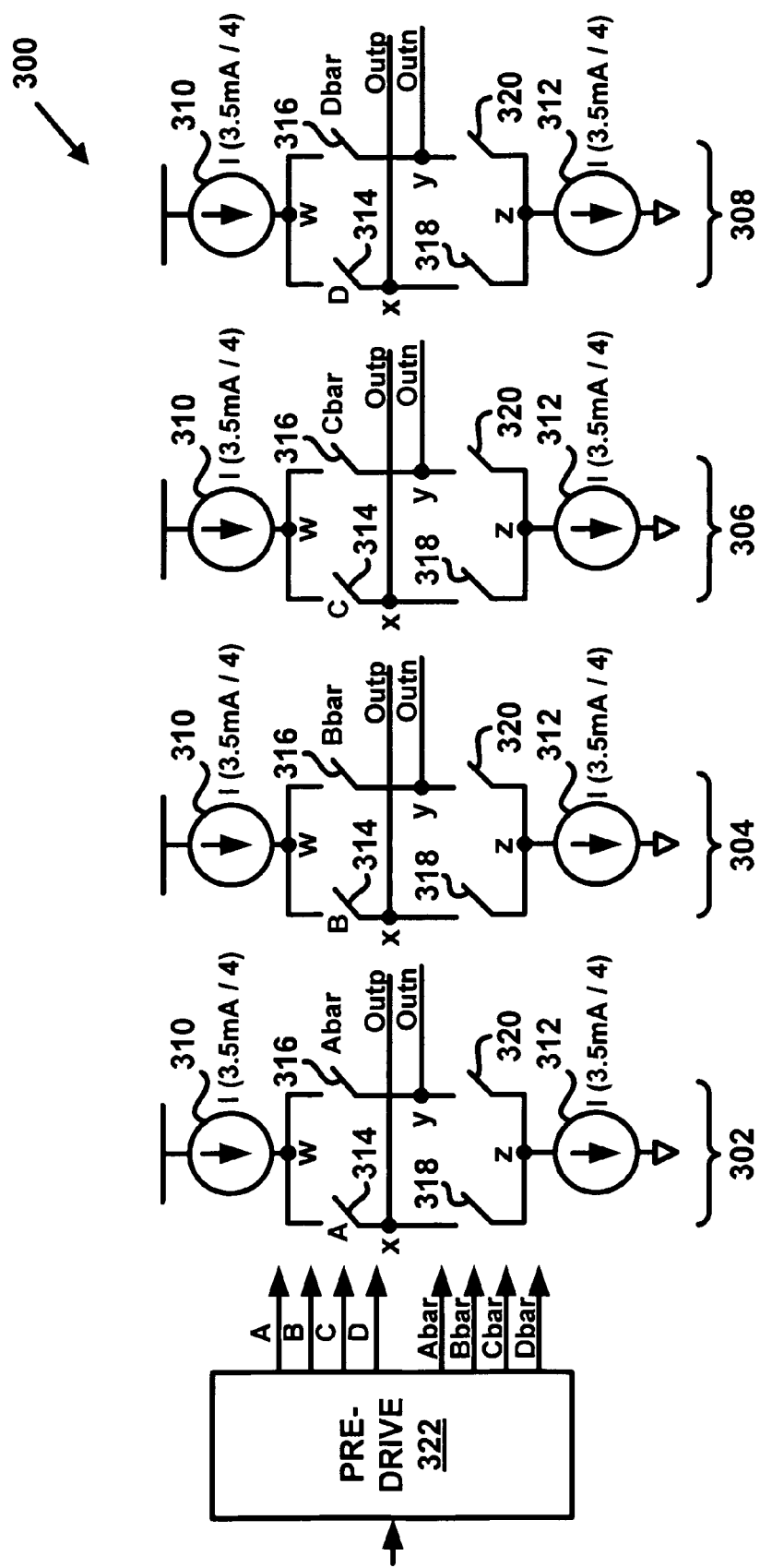
FIG. 3 is a circuit diagram of a hardened differential output buffer, according to an example.

FIG. 3 is a circuit diagram of a hardened differential output buffer 300. The differential output buffer 300 uses multiple current sources and pre-drive signals so that a single SEE strike affects only one of the current sources. This disruption to the single current source is not large enough to change the state of the output of the differential output buffer 300. As a result, the differential output buffer 300 can be used in applications in which the differential output buffer 300 is exposed to harsh environments, such as space and military applications.

The differential output buffer 300 is partitioned into multiple stages 302-308. Each of the stages 302-308 includes a similar number and arrangement of components. While the stages 302-308 may vary in some manner, the stages 302-308 are designed to provide substantially the same output upon receiving substantially the same input.

While FIG. 3 depicts four stages, more or fewer than four stages may be used. The number of stages is selected so that a particle strike on one of the stages 302-308 is not enough to impact the output of the differential output buffer 300. The amount of current supplied by the current sources may be used to select the appropriate number of stages.

As shown in FIG. 3, each of the stages 302-308 includes two current sources 310, 312. The first or top current source 310 is connected to node "w" of a transistor bridge. The second or bottom current source 312 is connected between ground and node "z" of the transistor bridge. Alternatively, just one current source may be used, either the top current source 310 like the differential output buffer 100 or the bottom current source 312 like the differential output buffer 200.

Each of the current sources 310, 312 provides a proportional amount of current. For example, if four stages are used, each current source 310, 312 provides one fourth of the current supply for the differential output buffer 300. Thus, if the current source for the differential output buffer 300 is 3.5 mA, each of the current sources 310, 312 provides approximately 0.875 mA. As a result, the amount of current pushed to or pulled from the output by any current source 310, 312 is limited.

The transistor bridge includes four transistors 314-320. The transistors 314-320 are depicted in FIG. 3 as switches to indicate that any transistor type, such as CMOS, bipolar, and so on, may be used in the stages 302-308. Preferably, the first and second transistors 314, 316 are p-channel transistors, while the third and fourth transistors 318, 320 are n-channel transistors. Alternatively, the first and second transistors 314, 316 are replaced with resistors like the differential output buffer 200.

As depicted in FIG. 3, the first transistor 314 is connected between nodes "w" and "x" of the transistor bridge. The second transistor 316 is connected between nodes "w" and "y" of the transistor bridge. The third transistor 318 is connected between nodes "x" and "z" of the transistor bridge. The fourth transistor 320 is connected between nodes "y" and "z" of the transistor bridge.

A pre-drive circuit 322 drives or controls the stages 302-308. The pre-drive circuit 322 provides each of the stages 302-308 with a complementary pair of digital signals. For example, if signal A is at a logic-1 level, signal Abar is designed to be at a logic-0 level; and if signal A is at a logic-0 level, signal Abar is designed to be at a logic-1 level. The number of complementary pairs depends on the number of stages used in the differential output buffer 300. As an example, FIG. 3 depicts four stages 302-308, so the pre-drive circuit 322 provides four complementary pairs (i.e., A, Abar; B, Bbar; C, Cbar; and D, Dbar).

The complementary pair outputs from the pre-drive circuit 322 are designed to be at the same logic levels (i.e., A=B=C=D and Abar=Bbar=Cbar=Dbar), but with various delays based on the locations of each of the stages 302-308. The delays may be created with any timer and/or delay circuit design. The delays are designed so that each of the stages 302-308 provides an output based on an input to the stages 302-308 at approximately the same time. Thus, the delay to the stage located the furthest away from the pre-drive circuit 322 is the shortest. Conversely, the delay to the stage located closest to the pre-drive circuit 322 is the longest. Preferably, the four stages 302-308 are positioned far enough away from each other to reduce the possibility of an SEE impacting more than one stage.

Each of the stages 302-308 provides a differential current output, $OUT_p$ and $OUT_n$. The differential current outputs from each of the stages 302-308 are designed to be substantially the same. $OUT_p$ is connected to node "x" of the transistor bridge, while $OUT_n$ is connected to node "y" of the transistor bridge. The differential current outputs from the stages 302-308 may be electrically connected such that all the $OUT_p$ signals are connected at a single circuit node "x" and all the $OUT_n$ signals are connected at a single circuit node "y." In this manner, the differential current outputs are effectively voted. Alternatively, the differential current outputs may be connected to voter circuitry, such as a comparator. As a result, if one of the stages is disrupted by an SEE, the disrupted stage does not contribute enough current to the output of the differential output buffer 300 to disrupt the differential current output signal.

A termination resistor may be connected between nodes "x" and "y" at a distance away from the stages 302-308. The termination resistor is not shown in FIG. 3, but is substantially the same as the termination resistors 112, 212 depicted in FIGS. 1 and 2, respectively.

The pre-drive circuit 322 controls the current flow through the stages 302-308. For example, when the A, B, C, and D signals are at a logic-1, the A, B, C, and D switches may close, while the switches controlled by the complementary signals Abar, Bbar, Cbar, and Dbar are opened. In this configuration, current may flow from the current source 310, through transistor 314, through a termination resistor connected between nodes "x" and "y," through transistor 320, and through current source 312 to ground. Similarly, if the pre-drive circuit 322 provides a logic-0 level on the A, B, C, and D outputs, the A, B, C, and D switches may open, while the switches controlled by the complementary signals Abar, Bbar, Cbar, and Dbar are closed. In this configuration, current may flow from the current source 310, through transistor 316, through a termination resistor connected between nodes "x" and "y," through transistor 318, and through current source 312 to ground.

As one example, the hardened differential output buffer 300 may be used in LVDS-style and CML-style output buffers. As another example, the hardened differential output buffer 300 may be used in a SerDes system. The SerDes system includes a dedicated serializer/deserializer pair and may be used in high-speed communication applications. By including the hardened differential output buffer 300 in LVDS-style output buffers, CML-style output buffers, or the SerDes system, these devices may be operated in environments susceptible to SEE.

It should be understood that the illustrated embodiments are examples only and should not be taken as limiting the scope of the present invention. The claims should not be read as limited to the described order or elements unless stated to that effect. Therefore, all embodiments that come within the scope and spirit of the following claims and equivalents thereto are claimed as the invention.

I claim:

1. A radiation hardened differential output buffer, comprising:
a plurality of stages configured to provide a substantially similar output signal at approximately a same time upon receiving a substantially similar input signal, wherein an output of each of the plurality of stages is electrically connected to provide an output of the differential output buffer, and wherein a radiation induced disruption experienced by a single stage is unable to change the output of the differential output buffer; and
a pre-drive circuit configured to provide the substantially similar input signal to the plurality of stages, and wherein the pre-drive circuit is further configured to delay the substantially similar input signal provided to at least one stage of the plurality of stages located further from the pre-drive circuit with a shorter delay than a delay associated with a stage located closer to the pre-drive circuit.

2. The differential output buffer of claim 1, wherein each of the plurality of stages comprises at least one current source and a bridge circuit.

3. The differential output buffer of claim 2, wherein each of the plurality of stages comprises two current sources.

4. The differential output buffer of claim 2, wherein the bridge circuit comprises four transistors.

5. The differential output buffer of claim 2, wherein the bridge circuit comprises two transistors and two resistors.

6. The differential output buffer of claim 2, wherein a number of stages included in the plurality of stages is based on an amount of current supplied by the at least one current source.

7. The differential output buffer of claim 1, wherein the output signal of each of the plurality of stages is a differential current signal.

8. The differential output buffer of claim 1, wherein the pre-drive circuit is configured to provide a complementary digital signal to each of the plurality of stages.

9. The radiation hardened differential output buffer of claim 1, wherein the shorter delay causes the plurality of stages to provide the substantially similar output signal at approximately the same time.

10. A radiation hardened differential output buffer, comprising:
a plurality of stages having two current sources connected to a transistor bridge circuit, wherein each of the plurality of stages is configured to provide a substantially similar differential current output signal at approximately a same time upon receiving a substantially similar complementary digital input signal, and wherein an output of each of the plurality of stages is electrically connected to provide an output of the differential output buffer; and
a pre-drive circuit configured to provide the substantially similar complementary digital input signal to each of the plurality of stages, wherein a radiation induced error experienced by one of the plurality of stages is unable to cause an erroneous signal at the output of the differential output buffer, and wherein the pre-drive circuit is further configured to delay the substantially similar input signal provided to at least one stage of the plurality of stages located further from the pre-derive circuit with a shorter delay than a delay associated with a stage located closer to the pre-drive circuit.

11. The differential output buffer of claim 10, wherein a number of stages included in the plurality of stages is based on an amount of current supplied by the current sources.

12. The differential output buffer of claim 10, wherein the transistor bridge circuit comprises two p-channel transistors and two n-channel transistors.

13. The radiation hardened differential output buffer of claim 10, wherein the shorter delay causes the plurality of stages to provide the substantially similar output signal at approximately the same time.

14. A method comprising:

driving, using a pre-drive circuit, each stage of a plurality of stages of a multi-stage buffer with a substantially similar digital input signal, wherein each stage has at least one current source and a bridge circuit, wherein an output of each stage is connected to a node, wherein each stage provides a substantially similar current signal at approximately a same time upon receiving the substantially similar digital input signal, and wherein a state of a signal at the node remains unchanged if a single stage experiences a radiation-induced disruption, wherein driving each stage of the plurality of stages comprises delaying the substantially similar digital input signal provided to at least one stage of the plurality of stages located further from a pre-drive circuit with a shorter delay than a delay associated with a stage located closer to the pre-drive circuit.

15. The method of claim 14, wherein a quantity of stages in the plurality of stages is based on an amount of current supplied by the at least one current source.

16. The method of claim 14, wherein driving the stages with the substantially similar digital input signal comprises controlling operation of the stages.

17. The method of claim 14, wherein driving the stages with the substantially similar digital input signal comprises delaying the signal so that the signal drives each of the stages at substantially a same time.

18. The method of claim 14, wherein the shorter delay causes the plurality of stages to provide the substantially similar output signal at approximately the same time.

* * * * *